United States Patent
Huang et al.

(10) Patent No.: US 12,288,783 B2
(45) Date of Patent: Apr. 29, 2025

(54) INTEGRATED STANDARD CELL STRUCTURE

(71) Applicant: Taiwan Semiconductor Manufacturing Company, Ltd., Hsin-Chu (TW)

(72) Inventors: Ming-Yang Huang, Kaohsiung (TW); Yung Feng Chang, Hsinchu (TW); Tung-Heng Hsieh, Hsinchu County (TW); Bao-Ru Young, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 477 days.

(21) Appl. No.: 17/712,015

(22) Filed: Apr. 1, 2022

(65) Prior Publication Data
US 2023/0138711 A1     May 4, 2023

Related U.S. Application Data

(60) Provisional application No. 63/275,557, filed on Nov. 4, 2021.

(51) Int. Cl.
*H01L 27/02* (2006.01)
*H01L 21/8238* (2006.01)
*H01L 27/092* (2006.01)

(52) U.S. Cl.
CPC .. *H01L 27/0207* (2013.01); *H01L 21/823842* (2013.01); *H01L 27/092* (2013.01); *H01L 27/0924* (2013.01); *H01L 21/823821* (2013.01); *H01L 21/823857* (2013.01)

(58) Field of Classification Search
CPC ......... H01L 27/0207; H01L 21/823842; H01L 27/092; H01L 27/0924; H01L 21/823821; H01L 21/823857; H01L 21/823878; H01L 29/0673; H01L 29/42392; H01L 29/66439; H01L 29/775; H01L 29/78696; B82Y 10/00
See application file for complete search history.

(56) References Cited

U.S. PATENT DOCUMENTS

| | | | |
|---|---|---|---|
| 8,796,666 B1 | 8/2014 | Huang et al. |
| 8,815,712 B2 | 8/2014 | Wan et al. |
| 8,963,258 B2 | 2/2015 | Yu et al. |
| 9,093,530 B2 | 7/2015 | Huang et al. |

(Continued)

*Primary Examiner* — Karen Kusumakar
*Assistant Examiner* — Adam S Bowen
(74) *Attorney, Agent, or Firm* — Haynes and Boone, LLP

(57) ABSTRACT

An IC includes a first standard cell (SC1) having a first circuit area (CA1) and a first transition area (TA1) placed on an edge of the CA1; and a SC2 having a CA2 and a TA2 placed on an edge of CA2'. CA1 includes a first and a second active region (AR1 and AR2) longitudinally oriented along a first direction (D1), and a first gate stack (G1) along a $D2 \perp D1$ and extending over AR1 and AR2. G1 includes a first gate segment (GS1) contacting AR1 and a GS2 contacting AR2. GS1 and GS2 are different in composition. GS1 and GS2 are associated with a pFET and a nFET, respectively. TA1 includes a G2 longitudinally oriented along D2 and spans between opposite cell edges of the SC1. G2 is a lengthwise uniform gate stack. SC2 is placed in abutment with the SC1 such that TA1 and TA2 share a common edge.

20 Claims, 9 Drawing Sheets

(56) References Cited

U.S. PATENT DOCUMENTS

| | | |
|---|---|---|
| 9,171,929 B2 | 10/2015 | Lee et al. |
| 9,214,555 B2 | 12/2015 | Oxland et al. |
| 9,236,267 B2 | 1/2016 | De et al. |
| 9,520,482 B1 | 12/2016 | Chang et al. |
| 9,548,303 B2 | 1/2017 | Lee et al. |
| 9,576,814 B2 | 2/2017 | Wu et al. |
| 2013/0285116 A1 | 10/2013 | Lochtefeld et al. |
| 2021/0074697 A1* | 3/2021 | Baek .................. H01L 29/0649 |
| 2023/0100505 A1* | 3/2023 | Penumatcha ..... H01L 29/42392 257/288 |

* cited by examiner

INTEGRATED STANDARD CELL STRUCTURE

BACKGROUND

This application claims priority to U.S. Provisional Patent Application Ser. No. 63/275,557 filed Nov. 4, 2021, the entire disclosure of which is hereby incorporated herein by reference.

In the design of integrated circuits (IC), standard cells with certain functions are repeated used with high frequency. Accordingly, those standard cells are predesigned and packed in a cell library. The cell library is provided to the IC designers for their particular designing. During integrated circuit designing, the standard cells are retrieved from the cell libraries and placed into desired locations, thus reducing the design effort. Routing is then performed to connect the standard cells and other circuit blocks to form the desired integrated circuit. Pre-defined design rules are followed when placing the standard cells into the desired locations. For example, a standard cell is placed close to another standard cell, the space between those two standard cells is determined according to the pre-defined rules. The reserved space between the standard cells and the cell boundaries results in a significant increase in the areas of the standard cells. In addition, the reserved space includes structures that increase the fabrication difficulty and risk with defects and circuit performance. The performance of the resulting circuit is degraded. Layout patterns and configurations can affect the yield and the design performance of the standard cells. It is therefore desired to have an integrated circuit layout structure, and the method making the same to address the above issues.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
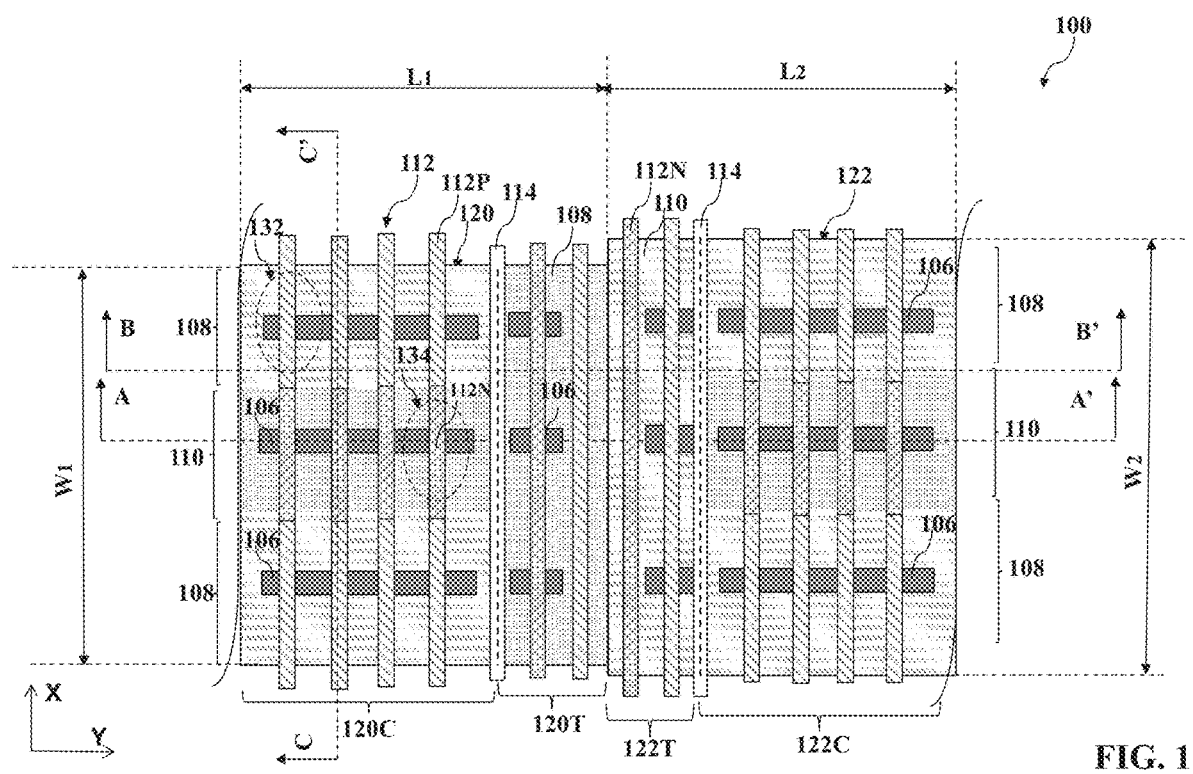
FIG. 1 is a top view of an integrated circuit (IC) structure constructed according to various aspects of the present disclosure in one embodiment.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

The present disclosure provides various embodiments of integrated circuit (IC) formed on a semiconductor substrate. The integrated circuit has a design layout incorporated with various standard cells. The standard cells are predesigned IC structure to be repeatedly used in individual IC designs. Effective IC design layouts include various predesigned standard cells and predefined rules of placing those standard cells for enhanced circuit performing and reduced circuit areas.

Figure 2A:
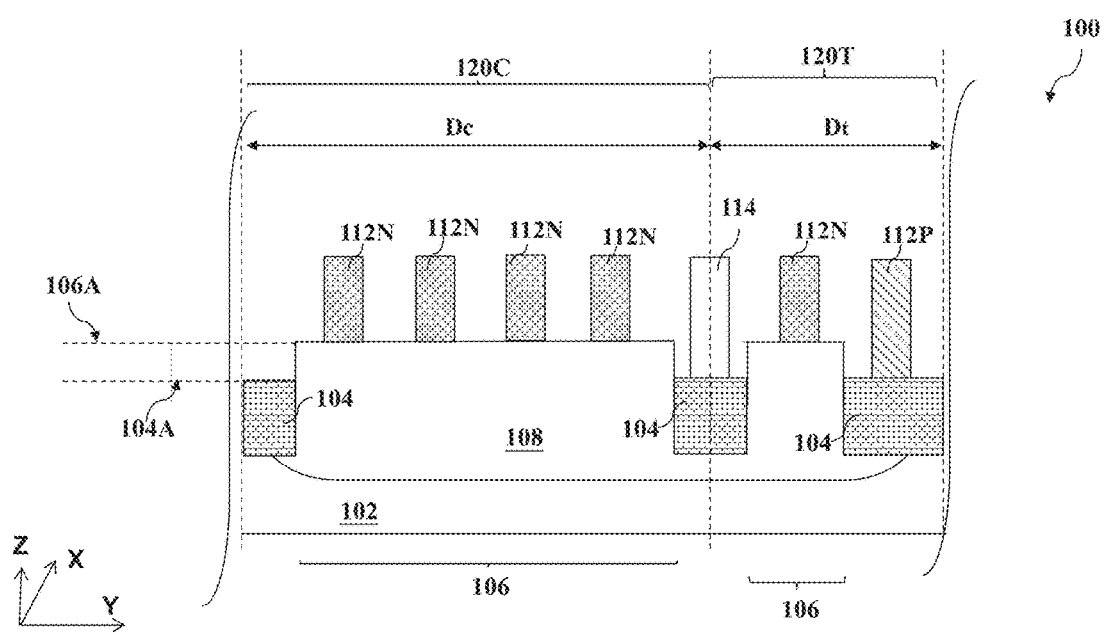
FIGS. 2A, 2B, and 2C are sectional views of the IC structure of FIG. 1, constructed according to various aspects of the present disclosure in one embodiment.
Figure 2B:
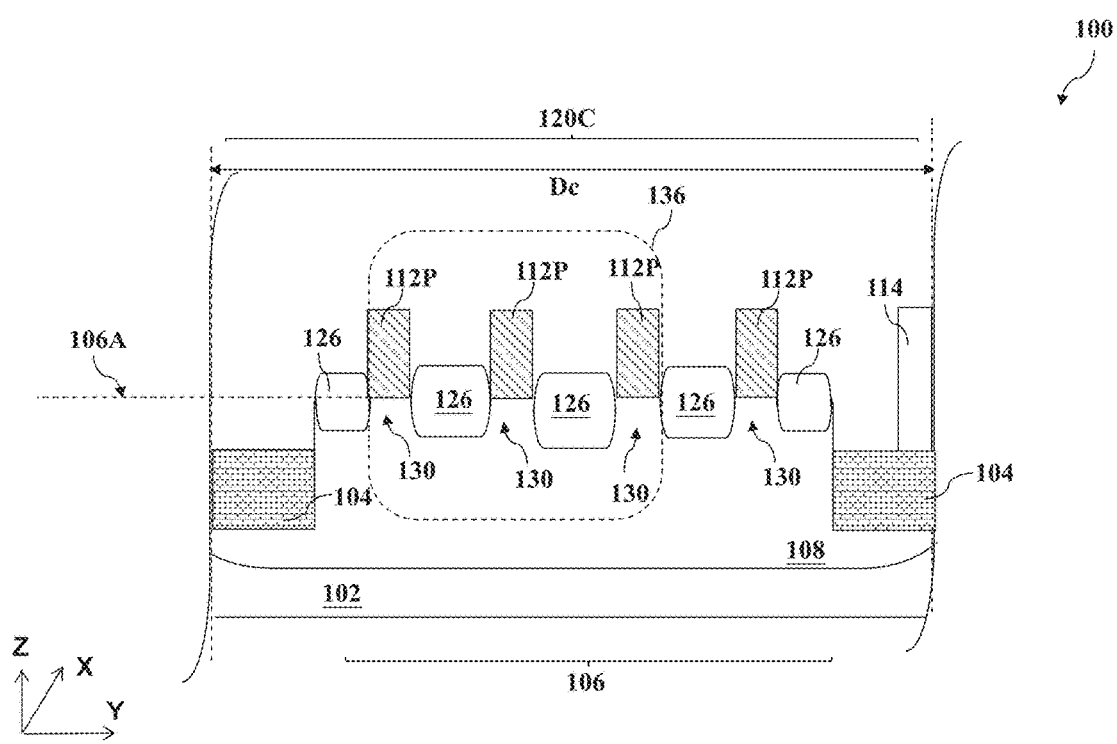
Figure 2C:
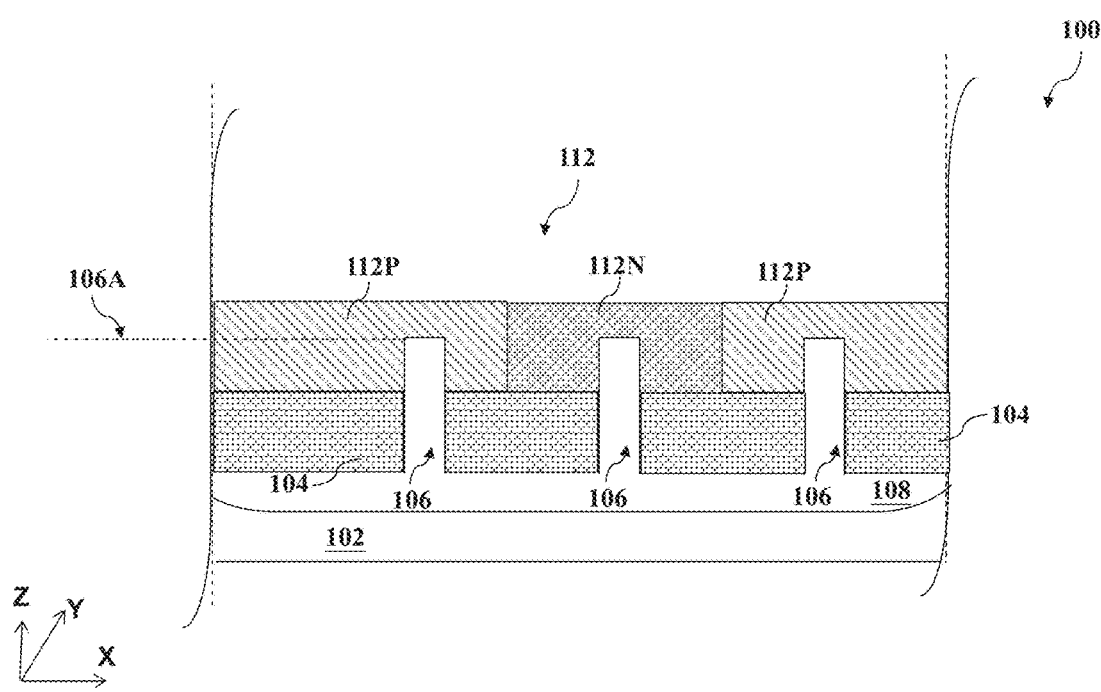

FIG. 1 is a top view of an integrated circuit (IC) structure 100, FIG. 2A is a sectional view of the IC structure 100, in portion, along the dashed line AA', FIG. 2B is a sectional view of the IC structure 100, in portion, along the dashed line BB', and FIG. 2C is a sectional view of the IC structure 100 along the dashed line CC', constructed according to various aspects of the present disclosure in one embodiment. In some embodiments, the IC structure 100 is formed on fin active regions and includes fin field-effect transistors (FinFETs). In some embodiments, the IC structure 100 is formed on active regions with a stack of semiconductor and includes multiple channels vertically stacked, such as gate-all-around (GAA) FET structure. In some embodiments, the IC structure 100 is formed on flat active regions and includes plain field-effect transistors (FETs). With the IC structure 100 as an example for illustration, an IC structure and a method to incorporate standard cells are collectively described.

In various embodiments, the IC structure 100 includes one or more standard cell placed to the IC layout by predefined rules. Those standard cells are repeatedly used in integrated circuit designs and therefore predesigned according to manufacturing technologies and saved in a standard cell library. IC designers could retrieve those standard cells, incorporate in their IC designs, and place into the IC layout according to the predefined placing rules. The standard cells may include various basic circuit devices, such as inverter, AND, NAND, OR, XOR, and NOR, which are popular in digital circuit design for applications, such as central processing unit (CPU), graphic processing unit (GPU), and system on chip (SOC) chip designs. The Standard cells may include other frequently used circuit blocks, such flip-flop circuit and latch. In the present example for illustration, the IC structure 100 includes two standard cells 120 and 122 placed adjacent each other.

The IC structure 100 includes a semiconductor substrate 102. The semiconductor substrate 102 includes silicon. Alternatively, the substrate 102 may include an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. Possible substrates 102 also include a silicon-on-insulator (SOI) substrate. SOI substrates are fabricated using separation by implantation of oxygen (SIMOX), wafer bonding, and/or other suitable methods.

The substrate 102 also includes various isolation features, such as isolation features 104 formed on the substrate 102 and defining various active regions 106 on the substrate 102.

In the present embodiments, the isolation feature 104 utilizes isolation technology, such as shallow trench isolation (STI), to define and electrically isolate the various active regions. Therefore, the isolation features 104 may also be referred to as STI features 104. Each active region 106 is surrounded by a continuous isolation feature such that it is separated and isolated from adjacent active regions. The isolation features 104 include silicon oxide, silicon nitride, silicon oxynitride, other suitable dielectric materials, or combinations thereof. The isolation features 104 are formed by any suitable process. As one example, the process of forming STI features 104 includes a lithography process to expose a portion of the substrate, etching a trench in the exposed portion of the substrate (for example, by using a dry etching and/or wet etching), filling the trench (for example, by using a chemical vapor deposition process) with one or more dielectric materials, and planarizing the substrate and removing excessive portions of the dielectric material(s) by a polishing process, such as a chemical mechanical polishing (CMP) process. In some examples, the filled trench may have a multi-layer structure, such as a thermal oxide liner layer and filling layer(s) of silicon nitride or silicon oxide.

The active region 106 is a region with semiconductor surface wherein various doped features are formed and configured to one or more device, such as a diode, a transistor, and/or other suitable devices. The active region 106 may include a semiconductor material similar to that (such as silicon) of the bulk semiconductor material of the substrate 102 or different semiconductor material, such as silicon germanium (SiGe), silicon carbide (SiC), or multiple semiconductor material layers (such as alternative silicon and silicon germanium layers) formed on the substrate 102 by epitaxial growth, for performance enhancement, such as strain effect to increase carrier mobility.

In some embodiments, the active region 106 is three-dimensional, such as a fin active region extended above the isolation feature. The fin active region 106 is extruded from the substrate 102 and has a three-dimensional profile for more effective coupling between the channel and the gate electrode of a FET. Particularly, the isolation feature 104 has a top surface 104A and the fin active region 106 has a top surface 106A that is vertically above the top surface 104A of the STI feature 104. The fin active region 106 may be formed by selective etching to recess the isolation features, or selective epitaxial growth to grow active regions with a semiconductor same or different from that of the substrate 102, or a combination thereof.

The semiconductor substrate 102 further includes various doped features, such as n-type doped wells, p-type doped wells, source and drain features, other doped features, or a combination thereof configured to form various devices or components of the devices, such as source and drain features of a field-effect transistor. In the present example illustrated in FIG. 1, the IC structure 100 includes a negatively doped well (also referred to as N well) 108 and a positively doped well (also referred to as P well) 110. The N well 108 includes negative dopant, such as phosphorus. And the P well 110 includes positive dopant, such as boron. The N well 108 and the P well 110 are formed by suitable technologies, such as ion implantation, diffusion or a combination thereof. In the present embodiment, one or more active region 106 is formed in the N well 108 and the P well 110, respectively.

Various IC devices are formed on the semiconductor substrate 102. The IC devices includes FETs, diodes, bipolar transistors, imaging sensors, resistors, capacitors, inductors, memory cells, or a combination thereof. In some embodiments, the IC devices are plain devices (such as FETs) formed on the flat active regions, 3D devices, such as FinFETs or GAA FETs, or a combination thereof.

The IC structure 100 further includes various gates (or gate stacks) 112 having elongated shape longitudinally oriented along a first direction (X direction) while the active regions 106 are longitudinally oriented along a second direction (Y direction). In the present embodiment, X and Y directions are orthogonal and define a top surface of the semiconductor substrate 102. A third direction (Z direction) is orthogonal to both X and Y directions, therefore being the normal direction of the top surface of the semiconductor substrate 102. A gate stack 112 includes a gate dielectric layer and a gate electrode. The gate stack 112 is a feature of a FET and functions with other features of the corresponding FET, such as source/drain (S/D) features and a channel, wherein the channel is a portion of the active region directly underlying the gate; and the S/D features are formed on the active region and are disposed on two sides of the gate stack. It is noted that the gate stack 112 should not be confused with a logic gate, such a NOR logic gate.

In some embodiments, the gates 112 are formed by a suitable fabrication procedure, such as a gate-last process. In furtherance of the embodiments, sacrificial gates are first formed by deposition and patterning, in which the patterning further includes lithography process and etching. Afterward, the sacrificial gates are replaced to form gate stacks 112 by selective etching to remove the sacrificial gates, resulting gate trenches; and depositing a gate dielectric layer and a gate electrode in the gate trenches. The gate electrode may include multiple conductive films designed such as a capping layer, a work function metal layer, a blocking layer and a filling metal layer (such as aluminum or tungsten). The multiple conductive films are designed for work function matching to n-type FET (nFET) and p-type FET (pFET), respectively. In some embodiments, the gate electrode for nFET includes a work function metal with a composition designed with a work function equal 4.2 eV or less and the gate electrode for pFET includes a work function metal with a composition designed with a work function equal 5.2 eV or greater. The work function metal layer for nFET is referred to as n-type work function metal or nWFM, and includes tantalum, titanium aluminum, titanium aluminum nitride or a combination thereof, according to some embodiments. The work function metal layer for pFET is referred to as p-type work function metal or pWFM, and includes titanium nitride, tantalum nitride or a combination thereof, according to some embodiments.

In the disclosed embodiment, the gate stacks 112 for n-type FETs and p-type FETs are different in term of composition, and therefore are referred to n-type gate stacks and p-type gate stacks, respectively. For example, the gate electrode of the gate stacks 112 for n-type FETs includes a n-type work function metal (nWFM), and the gate electrode of the gate stacks 112 for p-type FETs includes a p-type work function metal (pWFM), which is different from the n-type work function metal in composition. Each gate stack 112 may extend across multiple active regions 106 to form nFETs and pFETs. Accordingly, one gate stack 112 includes multiple segments for form nFETs and pFETs, respectively. The segments of the gate stack 112 for nFETs include nWFM and the segments of the gate stack 112 for pFETs include pWFM, therefore are referred to as n-type gate segments 112N and p-type gate segments 112P of the gate stack 112, respectively.

The IC structure 100 also includes dummy gates 114 disposed on the semiconductor substrate 102. A dummy gate 114 is not a gate and does not function as a gate. Instead, the dummy gate 114 is displaced on a proper location for other purpose, such isolation, tuning pattern density, or a combination thereof. In the present embodiment, the dummy gate 114 is a dielectric feature that includes one or more dielectric material and function as an isolation feature, in some instances. The dummy gate 114 is also referred to as a dielectric gate 114 in this case.

Each of the dielectric gates 114 also has an elongated shape longitudinally oriented along the X direction. The dielectric gates 114 are similar to the gates 112 in term of formation. In some embodiments, the gates 112 and the dielectric gates 114 are collectively formed by a procedure, such as a gate-last process. In furtherance of the embodiments, sacrificial gates are first formed by deposition and patterning, in which the patterning further includes lithography process and etching. Afterward, a subset of the sacrificial gates is replaced to form gate stacks 112 by depositing a gate dielectric layer and a gate electrode while the rest of the sacrificial gates are replaced to form dielectric gates 114 by depositing only dielectric material(s). Furthermore, the dielectric gate 114 is disposed and configured differently and therefore functions differently. In some embodiment, some dielectric gates 114 are placed on the borders of the standard cells to function as isolation to separate one standard cell to an adjacent standard cell, and some dielectric gates 114 may be alternatively or additionally placed inside the standard cells for one or more considerations, such as isolation between the adjacent FETs and adjust pattern density. In one example, a dielectric gate 114 is placed at the interface between the circuit area and the transition area of a standard cell. The circuit area and the transition area will be explained later in detail. Thus, the dielectric gates 114 provides isolation function between adjacent IC devices and additionally provides pattern density adjustment for improved fabrication, such as etching, deposition and chemical mechanical polishing (CMP).

As described above, the IC structure 100 includes various standard cells placed and configured on the semiconductor substrate 102 according to the predefined rules. A standard cell is a group of transistor and interconnect structures that provides a boolean logic function (such as AND, OR, XOR, XNOR, or inverters) or a storage function (such as flipflop or latch). Those standard cells are pre-designed and collected in an IC standard cell library for repeatedly use during IC design for compatible, consistent, and efficient IC design and IC fabrication. Proper design and configuration of the standard cells can enhance the packing density and circuit performance. The standard cells 120 and 122 are illustrated in FIG. 1. Standard cells 120 and 122 may be same or alternatively different IC cells. The standard cell 120 spans a dimension L1 along Y direction and a dimension W1 along X direction D2. L1 (or W1) and L2 (or W2) may be same or different.

In the present embodiment, two adjacent standard cells 120 and 122 are placed along the Y direction and are abutted with each other. Each standard cell includes a circuit area (such as 120C for cell 120 or 122C for cell 122) and one or more transition areas (such as 120T for cell 120 or 122T for cell 122) placed on edge(s) of the corresponding standard cell. For example, the two standard cells 120 and 122 are placed in contact with each other on the cell boundary, and the transition areas (such as 120T and 122T) are configured side by side. The circuit area is the area where functional devices of the standard cell are formed within. The transition area is the area designed to provide transition between adjacent standard cells such that the circuit performance is enhanced, the fabrication is simplified, and the fabrication capability is enhanced. In the present embodiment, a dielectric gate 114 is placed in the interface between the circuit area (such as 120C) and the corresponding transition area (such as 120T).

In the present embodiment, the transition area of a standard cell is configured such that the gate stack(s) 112 in the transition area is (are) is a uniform gate stack, including only one gate segment of n-type or p-type. Specifically, each gate stack 112 in the transition area is either totally n-type or p-type from end to end. This means that the gate stack 112 in the transition area includes only one n-type segment 112N or alternatively includes only one p-type segment 112P from end to end. This uniform gate stack 112 is referred to as a lengthwise uniform gate stack of n-type or p-type or one type of gate stack, which is either totally n-type or p-type. As to the circuit area, each gate stack 112 in the circuit area may include both n-type segments 112N and p-type segments 112P, depending on the specification of the corresponding standard cell. Take the first standard cell 120 of FIG. 1 as an example, each gate stack 112 in the circuit area 120C is extending over three active regions along X direction and includes three segments aligned and sequentially connected: a first p-type segment 112P, a n-type segment 112N, and a second p-type segment 112P.

FIG. 2A is a sectional view of the IC structure 100, constructed in accordance with some embodiments. Note that FIG. 2A only illustrates the first standard cell 120 for simplicity. In FIG. 2A, the Z direction is a direction perpendicular to the X and Y direction and is in the normal direction of the substrate 102. In the IC structure 100 illustrated in FIG. 2A, the top surface 106A of the active region 106 above the top surface 104A of the isolation feature 104 along the vertical direction (Z direction). The circuit area 120C spans a dimension Dc and the transition area 120T spans a dimension Dt along the Y direction.

FIG. 2B illustrates source/drain features 126 formed on the active region interposed by the gate stack 112. Note that FIG. 2B only illustrates portions of the IC structure 100. Particularly, only portion in the circuit area 120C of the first standard cell. Source/drain features 126, channel 130, and gate stack 112 are configured to form various transistors in a standard cell. For example, the first standard cell 120 includes one p-type FET (pFET) 132 in the N well 108 and one n-type FET (nFET) 134 in the P well 110. In the present embodiment, various pFETs and the nFETs in the first standard cell 120 (or the second standard cell 122) are integrated to form a functional circuit block, such as a complimentary FET, a logic gate, a static random-access memory (SRAM) cell, or other suitable circuit unit.

FIG. 2C illustrates a gate stack 112 extending through the standard cell 120 in the circuit area 120C. The gate stack 112 includes a plurality of segments sequentially connected. Those segments in one gate stack 112 belong to different types. For example, the gate stack in FIG. 2C includes two p-type gate segments 112P and n-type gate segment 112N.

In some embodiments, the transition area includes some functional devices. For example, in the standard cell 120, the transition area 120T includes a gate stack 112 of the n-type and extending across three active regions 106 to form three nFETs. Another gate stack 112 in the transition area 120T is the n-type from end to end and is disposed on the isolation feature 104. This gate stack 112 is a dummy gate since no functional transistors are formed therefrom. Either functional gate or dummy gate, each gate stack in the transition area 120T is of same-type (n-type or p-type) from end to end. The disclosed IC structure may have various embodiments, which will be further described later in various examples. For examples, the adjacent standard cells may be same, similar or different according to particular applications. Those adjacent standard cells may have same shape, same size or a combination thereof. The transition area of each standard cell may have same shape, same size or a combination thereof. In some embodiments, the transition area of each standard cell may include more or less functional gate stacks disposed on the active regions 106, and more or less dummy gate stacks disposed on the isolation features 104. The IC structure 100 illustrated in FIG. 2B includes fin active regions 106.

Figure 2D:
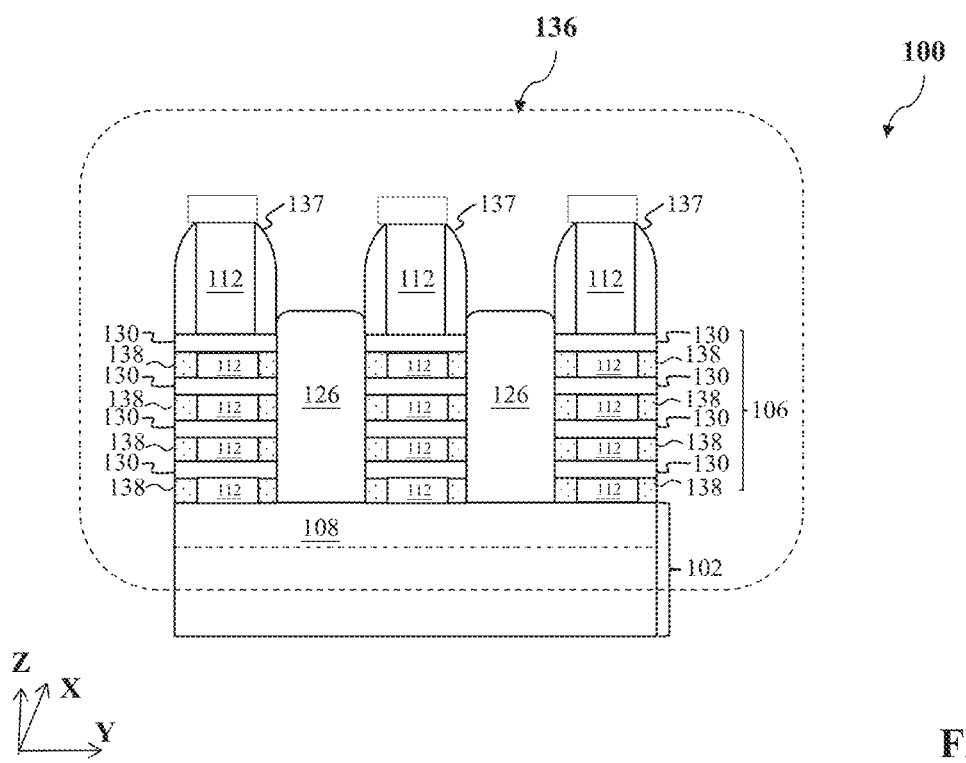
FIG. 2D is a sectional view of an IC structure constructed according to various aspects of the present disclosure in one embodiment.

However, it is not intended to be limiting. In some embodiment, the disclosed IC structure 100 can also be applied to other structure, such as GAA structure, as illustrated in FIG. 2D. FIG. 2D is a sectional view of the IC structure 100 having a GAA structure, in part, constructed according to some embodiments. Particularly, FIG. 2D only takes a portion 136 of the IC structure 100 from FIG. 2B. In FIG. 2D, the active region 106 includes multiple channels 130 vertically stacked and spaced away along the Z direction. The gate stack 112 is extending to wrap around each of the stacked channels 130 and fill in the spaces between the adjacent channels. The S/D features 126 are extending to connect to the multiple channels of the vertically stacked channels 130. The gate structure further includes gate spacer 137 disposed on sidewalls of the gate stack 112 above the channels. Inner spacers 138 are also formed below the gate spacer 137 to isolation the gate stack from the S/D features 126.

The disclosed configuration and circuit layout are advantageous in various embodiments. Due to the constrain of the adjacent gate placement between adjacent circuit cells, the adjacent circuit cells in the existing structure cannot or are difficult to be placed in an abutment, therefore costing more circuit area. Usually, a gate stack on a cell edge includes various segments of different types (such as n-type gate segments and p-type gate segments), fabrication (such as lithography process) has limitations and may introduce defects. For example, the different segments are patterned by respective lithography processes with respective photoresist, patterned photoresist edges of different types gate segments introduce various issues, such as defect, pealing, and/or residuals if too close, either aligned or not aligned, contacted or not contacted. With the disclosed structure, each gate stack in a transition area of a standard cell is same type from end to end, those issues are eliminated or reduced. Therefore, the adjacent standard cells can be displaced in abutment without risk the fabrication and circuit performance.

Figure 3:
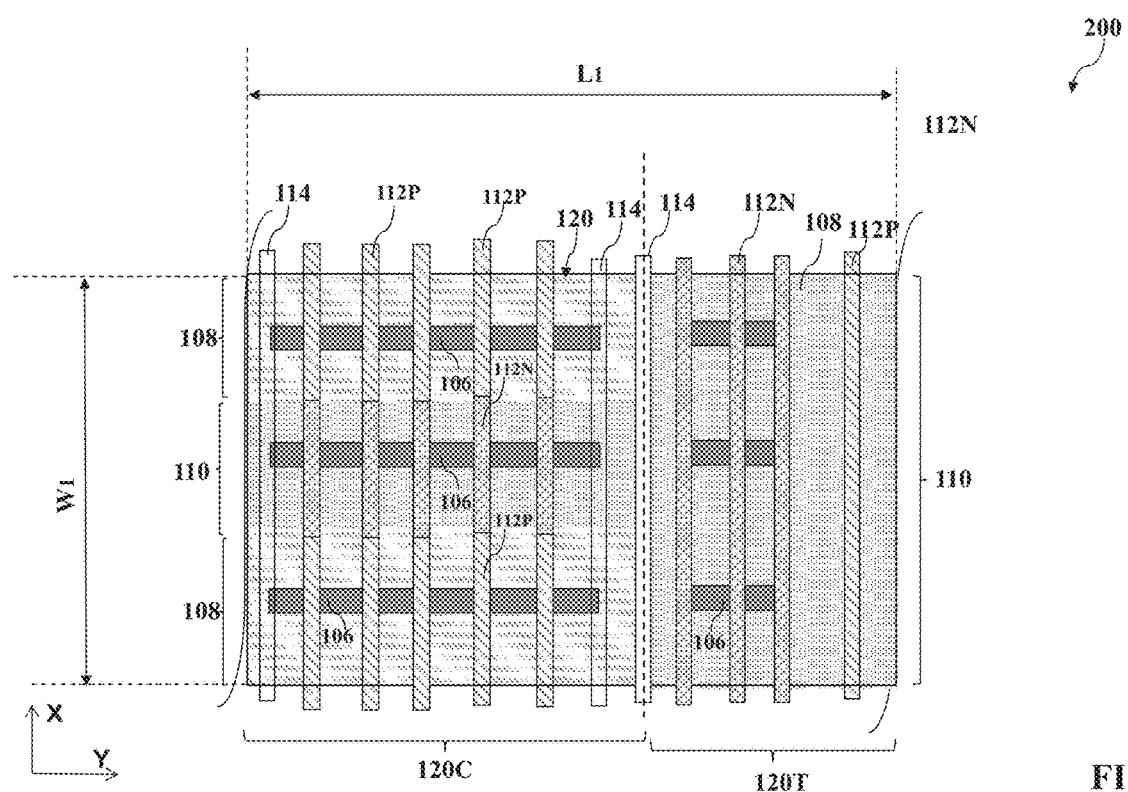
FIG. 3 is a top view of an IC structure constructed according to various aspects of the present disclosure in one embodiment.

FIG. 3 is a top view of an integrated circuit (IC) structure 200, constructed according to various aspects of the present disclosure in some embodiments. The IC structure 200 may be formed on fin active regions and includes fin field-effect transistors (FinFETs); be formed on active regions with a stack of semiconductor and includes multiple channels vertically stacked, such as GAA FET structure; or may be formed on flat active regions and includes plain FETs.

In FIG. 3, the IC structure 200 only illustrates one standard cell 120. As noted above, when the standard cell constructed with the disclosed layout structure, the standard cells are placed in abutment with reduction of the circuit area cost. The standard cell 120 in the IC structure 200 includes a circuit area 120C and at least one transition area 120T disposed on one edge of the circuit area 120C.

The circuit area 120C includes a plurality of doped wells longitudinally oriented along the Y direction, such as a first number N1 of the doped wells. In the present example, the first number N1 is 3 and the circuit area 120C includes two N-type doped wells 108 and one p-type doped well 110 disposed along the X direction. The circuit area 120C further includes a plurality of active regions 106 disposed in the respective doped wells and longitudinally oriented along the Y direction, such as the first number N1 (the first number N1 is 3 in the present example) of the active regions 106.

The circuit area 120C includes a plurality of gate stacks 112 longitudinally oriented along the X direction, such as a second number N2 of the gate stacks. In the present example, the second number N2 is 5 and the circuit area 120C includes 5 gate stacks 112 disposed along the Y direction. Especially, each gate stack 112 is extending over the plurality of the active regions 106 and includes multiple gate segments, such as the first number N1 of the gate segments, depending on individual application. In the present example, each gate stack 112 includes 3 gate segments, each gate segment having its respective type, such as an n-type gate segment 112N or a p-type gate segment 112P.

Furthermore, the circuit area 120C also includes dummy gate stacks disposed on the edges of the active regions 106 to enhance the circuit performance and improve the pattern density. Each of the edge dielectric gates 114 is partially landing on the isolation feature and is partially landing on the active region 106. This structure is also referred to as continuous poly on diffusion edge (CPODE). In some embodiments, the dummy gate stacks are similar to the functional gate stacks in terms of composition and formation, such as including gate dielectric layer and gate electrode; having multiple gate segments of different types; being formed by gate replacement process; or a combination thereof. In some embodiments, the dummy gate stacks are dielectric gate stacks 114, which includes only dielectric material(s), as described above.

The transition area 120T is placed in abutment with the circuit area 120C and includes one or more doped wells. In the present example, the transition area 120T includes one doped well, such as one p-type doped well 110. The transition area 120T further includes a plurality of active regions 106 disposed in the respective doped wells and longitudinally oriented along the Y direction, such as the first number N1 (the first number N1 is 3 in the present example) of the active regions 106.

The transition area 120T includes a plurality of gate stacks 112 disposed on the active regions 106, such as a third number m of the gate stacks. Those gate stacks are longitudinally oriented along the X direction. In the present example, the third number N3 is 1 and the transition area 120T includes 1 gate stack 112. The third number N3 is not limited to 1, any suitable number (such as N3=2 or 3) is applicable. Especially, each gate stack 112 is extending over the plurality of the active regions 106 and includes only one gate segment of the same type extending from end to end. In the present example, each gate stack 112 includes one gate segment of an n-type gate segment 112N. Those gate stacks 112 over the active regions 106 with the corresponding active regions 106 may be used to form functional devices, such FETs. Those gate stacks 112 not only provide proper transition from one cell to an adjacent cell but also provide transition effect from one standard cell to an adjacent standard cell.

The transition area 120T further includes a plurality of gate stacks 112 disposed on the isolation feature 104, such as a fourth number m of the gate stacks. Those gate stacks are longitudinally oriented along the X direction. In the present example, the fourth number N4 is 1 and the transition area 120T includes 1 gate stack 112 disposed on the isolation feature. The fourth number N4 is not limited to 1.

Any suitable number (such as N3=2 or 3) is applicable. Especially, each gate stack 112 is tending to the edges of the standard cell 120 and includes only one gate segment of the same type. In the present example, each gate stack 112 includes one gate segment of an p-type gate segment 112P. Those gate stacks 112 disposed on the isolation feature 104 are not functional and only provide proper transition from one standard cell to an adjacent standard cell.

Furthermore, the transition area 120T also includes one or more dummy gate stacks disposed on the edges of the active regions 106 to enhance the circuit performance and improve the pattern density. In some embodiments, the dummy gate stacks are similar to the functional gate stacks in terms of composition and formation, such as including gate dielectric layer and gate electrode; having multiple gate segments of different types; being formed by gate replacement process; or a combination thereof. In some embodiments, the dummy gate stacks are dielectric gate stacks 114, which includes only dielectric material(s).

Another dummy gate stack is disposed in the interface between the circuit area 120C and the transition area 120T. In the present embodiment, this dummy gate is a dielectric gate stack 114, as illustrated in FIG. 3. this dummy gate is a dielectric gate stack 114, as illustrated in FIG. 3. Alternatively, this dummy gate is similar to a functional gate stack in terms of composition and formation. In this case, it includes only one segment of n-type or p-type extending from end to end.

Figure 4:
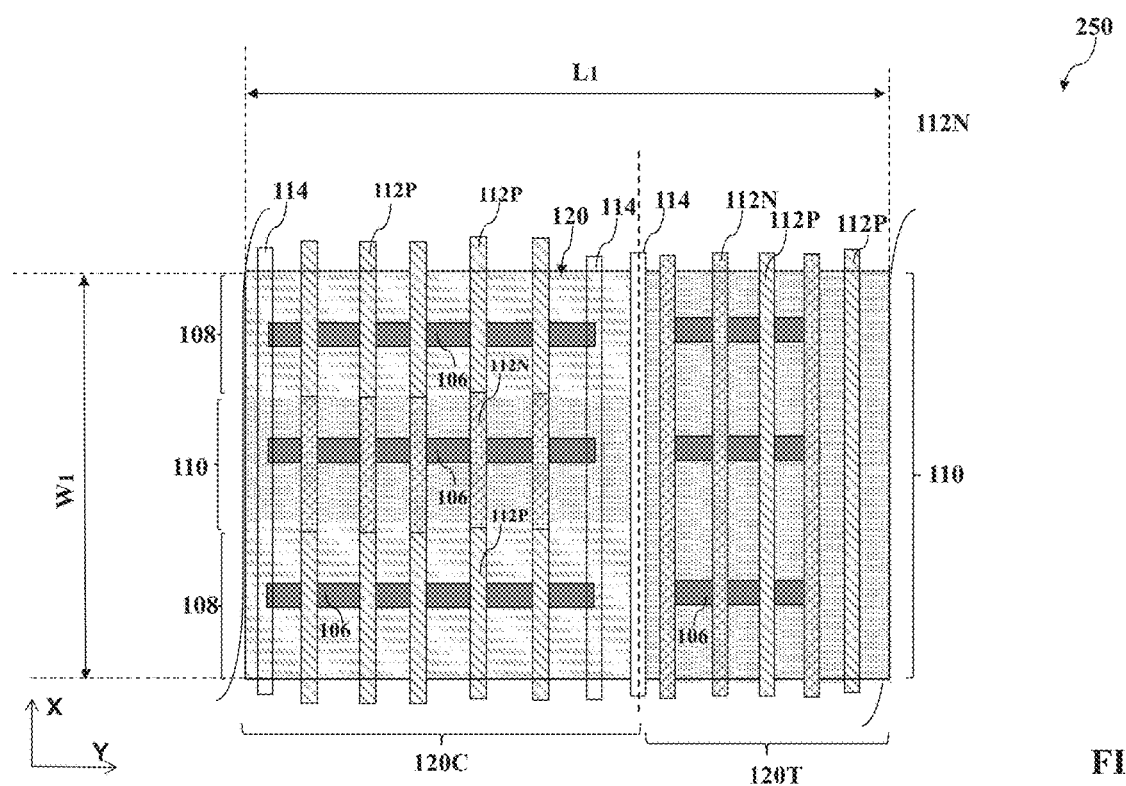
FIG. 4 is a top view of an IC structure constructed according to various aspects of the present disclosure in one embodiment.

FIG. 4 is a top view of an IC structure 250, constructed according to various aspects of the present disclosure in some embodiments. The IC structure 250 may be formed on fin active regions and includes fin field-effect transistors (FinFETs); be formed on active regions with a stack of semiconductor and includes multiple channels vertically stacked, such as GAA FET structure; or may be formed on flat active regions and includes plain FETs. The IC structure 250 is similar to the IC structure 200. The similar features will not be repeat for simplicity. In FIG. 4, the transition area 120T includes more than one gate stacks 112 disposed on the active regions 106. In the present example, the third number N3 is 2. The gate stacks disposed on the active regions 106 may have different type, such as a first one is an n-type gate stack 112N and second one is a p-type gate stack 112P, being different from the first one. However, each one gate stack 112 includes only one type. In this case, the second one, as a p-type gate stack 112P may not function and serves as a dummy gate stack.

Figure 5A:
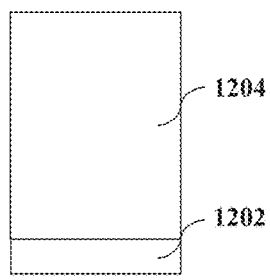
FIGS. 5A, 5B and 5C are sectional views of a gate stack in an IC structure in accordance with some embodiments.
Figure 5B:
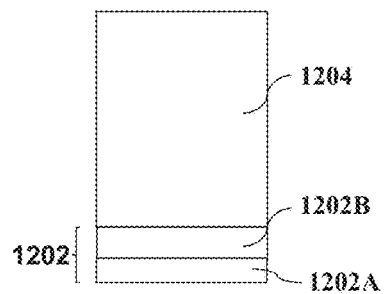

In various embodiments described above, the gate stacks 112 are further described with reference to FIGS. 5A-5C in sectional views, according to various embodiments. The gate stack 112 includes a gate dielectric layer 1202 (such as silicon oxide) and a gate electrode 1204 (such as doped polysilicon) disposed on the gate dielectric layer, as illustrated in FIG. 5A.

In some embodiments, the gate stack 112 alternatively or additionally includes other proper materials for circuit performance and manufacturing integration. For example, the gate dielectric layer 1202 includes an interfacial layer 1202A (such as silicon oxide) and a high k dielectric material layer 1202B, as illustrated in FIG. 5B. The high k dielectric material may include metal oxide, metal nitride or metal oxynitride. In various examples, the high k dielectric material layer includes metal oxide: ZrO2, Al2O3, and HfO2, formed by a suitable method, such as metal organic chemical vapor deposition (MOCVD), physical vapor deposition (PVD), atomic layer deposition (ALD), or molecular beam epitaxy (MBE). In some examples, the interfacial layer includes silicon oxide formed by ALD, thermal oxidation or ultraviolet-Ozone Oxidation. The gate electrode 1204 includes metal, such as aluminum, copper, tungsten, metal silicide, doped polysilicon, other proper conductive material or a combination thereof. The gate electrode may include multiple conductive films designed such as a capping layer, a work function metal layer, a blocking layer and a filling metal layer (such as aluminum or tungsten). The multiple conductive films are designed for work function matching to n-type FET (nFET) and p-type FET (pFET), respectively. In some embodiments, the gate electrode for nFET includes a work function metal with a composition designed with a work function equal 4.2 eV or less and the gate electrode for pFET includes a work function metal with a composition designed with a work function equal 5.2 eV or greater. For examples, the work function metal layer for nFET includes tantalum, titanium aluminum, titanium aluminum nitride or a combination thereof. In other examples, the work function metal layer for pFET includes titanium nitride, tantalum nitride or a combination thereof.

Figure 5C:
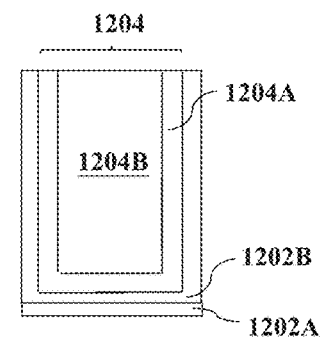

In some embodiments illustrated in FIG. 5C, the gate stack 112 is formed by a different method with a different structure. The gate may be formed by various deposition techniques and a proper procedure, such as gate-last process, wherein a dummy gate is first formed, and then is replaced by a metal gate after the formation the source and drain features. Alternatively, the gate is formed by a high-k-last a process, wherein both gate dielectric material layer and the gate electrode are replaced by high k dielectric material and metal, respectively, after the formation of the source and drain features. In a high-k-last process, a dummy gate is first formed by deposition and patterning; then source/drain features are formed on gate sides and an inter-layer dielectric layer is formed on the substrate; the dummy gate is removed by etching to result in a gate trench; and then the gate material layers are deposited in the gate trench. In the present example, the gate electrode 1204 includes a work function metal layer 1204A and a filling metal 1204B, such as aluminum or copper. Such formed gate stack 112 has various gate material layers U-shaped.

Figure 6:
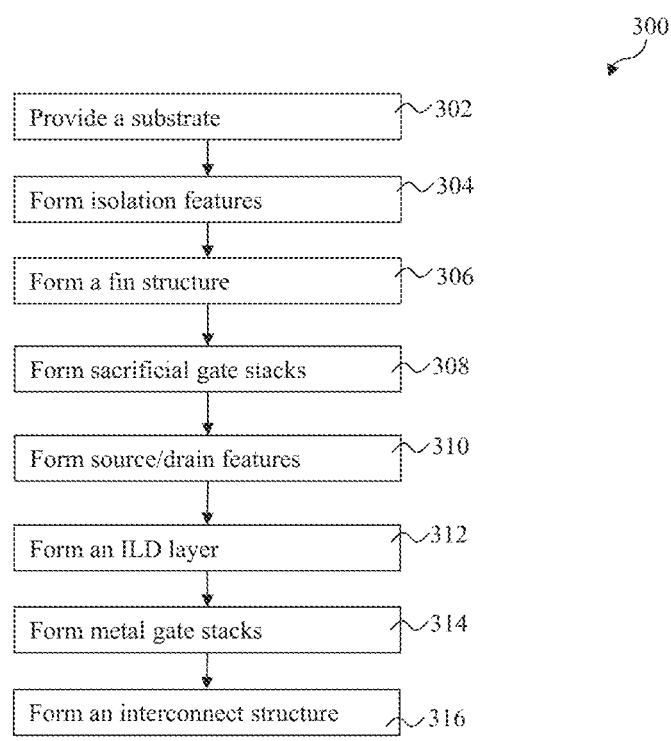
FIG. 6 is a flowchart of a method making an IC structure, constructed according to various aspects of the present disclosure in one embodiment.

The method 300 making the IC structure 100 (or 200 or 250) is described with reference to FIG. 6 according to some embodiments. FIG. 6 is a flowchart of a method 300 to form an integrated circuit structure in accordance with some embodiments. In the present embodiment, the IC structure making by the method 300 includes fin active regions and FinFETs.

The method 300 begins at block 302 by providing or receiving a workpiece having a substrate 102. In some embodiments, the substrate 102 includes silicon. Alternatively, the substrate 102 may include other elementary semiconductor such as germanium in accordance with some embodiments. In some embodiments, the substrate 102 additionally or alternatively includes a compound semiconductor such as silicon carbide, gallium arsenic, indium arsenide, and indium phosphide. In some embodiments, the substrate 102 includes an alloy semiconductor such as silicon germanium, silicon germanium carbide, gallium arsenic phosphide, and gallium indium phosphide. The substrate 102 may be uniform in composition or may include various layers. The layers may have similar or different compositions, and in various embodiments, some substrate layers have non-uniform compositions to induce device strain and thereby tune device performance. The substrate 102 may include an epitaxial layer formed on the top surface, such as an epitaxial semiconductor layer overlying a bulk semiconductor wafer. In various embodiments, the substrate 102 includes one or more epitaxially grown semiconductor material. For example, a silicon layer is epitaxially grown on a silicon wafer. In another example, a silicon germanium layer is epitaxially grown on a silicon wafer. In yet another example, silicon and silicon germanium are alternatively epitaxially grown on a silicon wafer. In some embodiments, suitable deposition processes for epitaxy growth include atomic layer deposition (ALD), chemical vapor deposition (CVD), high-density plasma CVD (HDP-CVD), physical vapor deposition (PVD) and/or other suitable deposition processes. Any of these techniques may be used to grow the semiconductor layer having any composition including a graded composition. Examples of layered substrates include silicon-on-insulator (SOI) substrates. For example, the substrate may include a buried oxide (BOX) layer formed by a process such as separation by implanted oxygen (SIMOX). In some such examples, the substrate 210 may include an embedded insulating layer such as a silicon oxide, a silicon nitride, a silicon oxynitride, or other suitable insulating materials.

The method 300 includes an operation 304 by forming one or more isolation feature 104 in the substrate 102. In the present embodiment, the isolation features 104 are shallow trench isolation (STI) features. The STI features 104 are formed by any suitable procedure including deposition, photolithography, and/or etching processes. In one embodiment, the STI features 104 are formed by a procedure including forming a first hard mask layer, applying an etch process to the substrate 102 through the openings of the first hard mask layer to form trenches in the substrate 102, filling in the trenches with one or more dielectric material, and performing a chemical mechanical polishing (CMP) process to remove excessive dielectric material and planarize the top surface, thereby forming the STI features 104 and defining active regions 106. The isolation features 104 are formed on the substrate 102 in a figuration to isolate various active regions 106. The isolation features 104 include silicon oxide, silicon nitride, silicon oxynitride, low-k dielectric material, other suitable dielectric materials, or combinations thereof. In various examples, the hard mask layer may be formed by depositing a material layer (such as silicon nitride), forming a patterned photoresist (resist) layer by a lithography process, and etching the material layer through the openings of the patterned photoresist layer to form the patterned hard mask layer. The CMP process may additionally remove the hard mask layer as well. Alternatively, the hard mask layer may be removed by an etch process, such as wet etch, after the CMP process. An exemplary photolithography process may include forming a photoresist layer, exposing the resist by a lithography exposure process, performing a post-exposure bake process, and developing the photoresist layer to form the patterned photoresist layer. The lithography process may be alternatively replaced by other technique, such as e-beam writing, ion-beam writing, maskless patterning or molecular printing. In another embodiment, the patterned photoresist layer directly uses the patterned mask layer as an etch mask of the etch process to form the trenches in the substrate 102. In yet another embodiment, the patterned hard mask layer includes silicon oxide, silicon nitride, silicon oxynitride, or any other suitable dielectric material. The patterned hard mask layer may include a single material layer or multiple material layers. The hard mask layer may be formed by thermal oxidation, CVD, ALD, or any other appropriate method.

The method 300 includes an operation 306 by forming a fin structure to have one or more fin active regions (or simply fins or active regions) 106 on the substrate 102. In some embodiments, the fin active regions 106 are formed by recessing the STI features 104 using a suitable etching process. The STI features 104 are recessed by selective etching with etchant designed to selectively remove the material(s) of the STI features 104. Any suitable etching technique may be used to recess the STI features 104, including dry etching, wet etching, RIE, and/or other etching methods. In an exemplary embodiment, an anisotropic dry etching is used to selectively etch the STI features 104 without etching the semiconductor material of fins 106, with a proper etching gas, such as fluorine-containing or chlorine-containing gas. Alternatively, or additionally, selective epitaxial growth may be used to selectively grow one or more semiconductor material on the active regions such that the active regions vertically extrude above the STI features 104, thereby forming fins 106. By selective epitaxial growth, silicon (Si) features, silicon germanium (SiGe) features, silicon carbide (SiC) features, and/or other suitable semiconductor features are grown in a crystalline state on the active regions. Suitable epitaxial growth processes include CVD deposition techniques (e.g., vapor-phase epitaxy (VPE) and/or ultra-high vacuum CVD (UHV-CVD), molecular beam epitaxy, and/or other suitable epitaxial growth techniques.

The method 300 includes an operation 308 by forming gate stacks on the fins 106. The gate stacks 112 are formed on multiple surfaces of the fins 106 to achieve high capacitive coupling between gate stacks and respective channel regions 130 (portions of the fins underlying respective gate stacks) for enhanced device performance, such as reduced threshold voltage. In the present embodiment, the gate stacks formed at this stage will be replaced by metal gate stacks at later fabrication stage, therefore also be referred to as sacrificial gate stacks. The sacrificial gate stacks are formed over the channel regions of the fins 106. In some examples, the formation of the sacrificial gate stacks includes depositing a sacrificial gate layer containing polysilicon or other suitable material; and patterning the sacrificial gate layer to form sacrificial gate stacks. A gate hard mask layer may be formed on the sacrificial gate material layer and is used as an etch mask for patterning the sacrificial gate layer. The gate hard mask layer may include any suitable material, such as a silicon oxide, a silicon nitride, a silicon carbide, a silicon oxynitride, other suitable materials, or combinations thereof. In some embodiments, one or more gate sidewall feature (gate spacer) is formed on the sidewalls of the sacrificial gate stacks. The gate sidewall feature may be used to isolate the subsequently formed source/drain features from the gate stacks; or may be used to offset the source/drain features. The gate sidewall feature may include any suitable dielectric material, such as a semiconductor oxide, a semiconductor nitride, a semiconductor carbide, a semiconductor oxynitride, other suitable dielectric materials, and/or combinations thereof. In some embodiments, the gate sidewall feature may include multiple layers, such as a first layer of silicon oxide and a second layer of silicon nitride. In one example, the gate sidewall feature is formed by deposition and anisotropic etching, such as dry etching. In another example, the first layer of the gate sidewall feature is formed by ALD and the second layer of the gate sidewall feature is formed by deposition and anisotropic etching.

The method 300 includes an operation 310 by forming source and drain (S/D) features 126 on the active regions 106. In the present embodiment, the S/D features 126 are epitaxially grown semiconductor features within the source/drain regions, which are defined on the fins and interposed by channel regions 130. The epitaxial source/drain features 126 may be formed by selective epitaxial growth (SEG) for strain effect with enhanced carrier mobility and device performance. The gate stacks (including gate spacer) constrain the SEG process such that the source/drain features 126 are self-aligned within the source/drain regions. In many embodiments, the source/drain features 126 are formed by one or more selective epitaxial growth (epitaxial process), whereby silicon (Si) features, silicon germanium (SiGe) features, silicon carbide (SIC) features, and/or other suitable semiconductor features are grown in a crystalline state on the fin structure within the source/drain regions. In an alternative embodiment, an etching process is first applied to recess portions of the fins 106 within the source/drain regions before the epitaxial growth. The etching process may also remove any dielectric material disposed on the source/drain regions, such as those formed during the formation of the gate sidewall features. Suitable epitaxial processes include CVD deposition techniques, molecular beam epitaxy, and/or other suitable processes. The S/D features 126 may be in-situ doped during the epitaxial process by introducing doping species including: p-type dopants, such as boron or $BF_2$; and n-type dopants, such as phosphorus or arsenic. If the S/D features 126 are not in-situ doped, an implantation process (i.e., a junction implant process) is performed to introduce the corresponding dopants into the S/D features 126. In an exemplary embodiment, the S/D features 126 in an nFET include silicon doped with phosphorous (SiP) or silicon carbide doped with phosphorous (SiCP), while those in a pFET include silicon germanium doped with boron (SiGeB), SiGeSnB (tin may be used to tune the lattice constant) and/or GeSnB. The S/D features 126 may include more than one semiconductor material layers. For example, a silicon germanium layer is epitaxially grown on the substrate within the source/drain regions and a silicon layer is epitaxially grown on the silicon germanium layer. One or more annealing processes may be performed thereafter to activate the S/D features 126. Suitable annealing processes include rapid thermal annealing (RTA), laser annealing processes, other suitable annealing technique or a combination thereof. In some other embodiments, the S/D features 126 may be epitaxially grown to a raised level. In some embodiments, the epitaxial grown S/D features 126 on different fins 106 are separated from each other. Alternatively, the lateral epitaxial growth may cause epitaxial grown S/D features 126 on adjacent fins 106 are merged together to form shared S/D features 126.

The method 300 includes an operation 312, in which an inter-level dielectric material (ILD) layer is formed on the substrate to cover the S/D features 126 in the source/drain regions. The ILD layer acts as an insulator that supports and isolates conductive traces. The ILD layer may include any suitable dielectric material, such as a silicon oxide, low-k dielectric material, porous dielectric material, other suitable dielectric material or a combination thereof. In an alternative embodiment, an etch stop layer may deposited on the substrate before the forming of the ILD layer to provide etch stopping during the etching to form contacts in the ILD during later fabrication stages. The etch stop layer includes a material different from that of the ILD layer to provide etch selectivity. For example, the etch stop layer may include silicon nitride deposited by CVD or ALD. In some embodiments, the formation of the ILD layer includes deposition and CMP to provide a planarized top surface. The hard mask used to pattern gate stacks may be removed during the CMP process, an additional etching operation, or a combination thereof.

The method 300 includes an operation 314 by forming metal gate stacks 112 to replace the sacrificial gate stacks. The metal gate stacks 112, the S/D features 126 and channel regions 130 are configured to form various FinFETs, such as nFinFETs and pFinFETs. In the operation 314, the sacrificial gate stacks are removed by suitable selective etching (such as wet etching), resulting in gate trenches. The etching process may include multiple etching steps to remove the sacrificial gate stacks if more materials present. After the removal of the sacrificial gate stacks, metal gate materials (gate dielectric layer and gate electrode) are deposited in the gate trenches, and a CMP process is applied to remove the excessive gate materials and planarize the top surface. The gate materials of the metal gate stack 112 include gate dielectric layer and gate electrode, as described in FIGS. 5A-5C. Especially, the n-type gate stacks and gate segments are formed separately from the p-type gate stacks and gate segments due to different composition. For example, after the sacrificial gate stacks are removed, the n-type gate materials are deposited in the gate trenches for n-type gate stacks and n-type gate segments while the gate trenches for p-type gate stacks and p-type gate segments are covered by a patterned photoresist (formed by a lithography process) or a patterned hard mask (formed by deposition lithography process, and etching). Thereafter or before, the p-type gate materials are deposited in the gate trenches for p-type gate stacks and p-type gate segments while the gate trenches for n-type gate stacks and n-type gate segments are covered by a patterned photoresist or a patterned hard mask.

The method 300 includes an operation 316 by forming an interconnect structure to couple various devices into an integrated circuit. The interconnect structure includes various metal lines, contacts and vias to provide horizontal and vertical electrical routings.

The present disclosure provides various embodiments of an IC structure having multiple standard cells. Each standard cell is designed to have a circuit area and at least one transition area on an edge of the circuit area. The standard cells are configured in abutment such that a standard cell is in contact to the edge of the transition area of the adjacent standard cell. Each of the gate stacks in the transition area of a standard cell is designed to be one type (such as n-type gate or p-type gate) from ed to end, Various advantages may present in various embodiments. By utilizing the disclosed layout having multiple standard cells, the IC structure, such as a logic circuit, has a high packing density and enhanced circuit performance. Furthermore, the uniform local density of the dielectric gates and the gates lead to better device performance and processing uniformity.

In one example aspect, the present disclosure provides an integrated circuit. The integrated circuit includes a first standard cell having a first circuit area and a first transition area placed on an edge of the first circuit area, and a second standard cell having a second circuit area and a second transition area placed on an edge of the second circuit area. The first circuit area includes a first active region and a second active region being longitudinally oriented along a first direction; the first circuit area includes a first gate stack being longitudinally oriented along a second direction and extending over the first active region and the second active region, the second direction being perpendicular to the first direction; the first gate stack includes a first gate segment contacting the first active region and a second gate segment contacting the second active region, wherein the first gate segment and the second gate segment are different in composition, and wherein the first gate segment is associated with a first p-type field-effect transistor (pFET) and the second gate segment is associated with a first n-type field-effect transistor (nFET); the first transition area includes a second gate stack being longitudinally oriented along the second direction and spans between opposite cell edges of the first standard cell, the second gate stack is a lengthwise uniform gate stack; and the second standard cell is placed in abutment with the first standard cell such that the first and second transition areas share a common edge.

In another example aspect, the present disclosure provides an integrated circuit. The integrated circuit includes a first standard cell formed on a substrate and having a first circuit area and a first transition area placed on an edge of the first circuit area. The first circuit area includes a first active region and a second active region being longitudinally oriented along a first direction. The first circuit area includes a first gate stack being longitudinally oriented along a second direction and extending over the first active region and the second active region, the second direction being perpendicular to the first direction. The first gate stack includes a first gate segment contacting the first active region and a second gate segment contacting the second active region, wherein the first gate segment and the second gate segment are different in composition, and wherein the first gate segment is associated with a first p-type field-effect transistor (pFET) and the second gate segment is associated with a first n-type field-effect transistor (nFET). The first transition area further includes a third active region and a fourth active region being longitudinally oriented along a first direction. The first transition area includes a second gate stack and a third gate stack being longitudinally oriented along the second direction and spanning between opposite cell edges of the first standard cell, each of the second and third gate stack is a lengthwise uniform gate stack. The first standard cell includes a dielectric gate disposed on an interface between the first circuit and first transition areas.

In yet another example aspect, the present disclosure provides a method of making an integrated circuit. The method includes forming a first standard cell and a second standard cell on a semiconductor substrate. The first standard cell includes a first circuit area and a first transition area placed on an edge of the first circuit area. The first circuit area includes a first active region and a second active region being longitudinally oriented along a first direction. The first circuit area includes a first gate stack being longitudinally oriented along a second direction and extending over the first active region and the second active region, the second direction being perpendicular to the first direction. The first gate stack includes a first gate segment contacting the first active region and a second gate segment contacting the second active region, wherein the first gate segment and the second gate segment are different in composition, and wherein the first gate segment is associated with a first p-type field-effect transistor (pFET) and the second gate segment is associated with a first n-type field-effect transistor (nFET). The first transition area includes a second gate stack being longitudinally oriented along the second direction and spans between opposite cell edges of the first standard cell. The second gate stack is a lengthwise uniform gate stack. The first standard cell further includes a dielectric gate disposed at an interface between the first circuit area and the first transition area. The second standard cell includes a second circuit area and a second transition area placed on an edge of the second circuit area, the first and second transition areas sharing a common edge.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An integrated circuit, comprising:
a first standard cell having a first circuit area and a first transition area placed on an edge of the first circuit area, wherein
the first circuit area includes a first active region and a second active region being longitudinally oriented along a first direction,
the first circuit area includes a first gate stack being longitudinally oriented along a second direction and extending over the first active region and the second active region, the second direction being perpendicular to the first direction,
the first gate stack includes a first gate segment contacting the first active region and a second gate segment contacting the second active region, wherein the first gate segment and the second gate segment are different in composition, and wherein the first gate segment is associated with a first p-type field-effect transistor (pFET) and the second gate segment is associated with a first n-type field-effect transistor (nFET), and
the first transition area includes a second gate stack being longitudinally oriented along the second direction and spans between opposite cell edges of the first standard cell, the second gate stack is a lengthwise uniform gate stack; and
a second standard cell having a second circuit area and a second transition area placed on an edge of the second circuit area, wherein the second standard cell is placed in abutment with the first standard cell such that the first and second transition areas share a common edge, wherein the first standard cell further includes a dielectric gate disposed at an interface between the first circuit area and the first transition area.

2. The integrated circuit of claim 1, wherein
the second circuit area includes a third active region and a fourth active region being longitudinally oriented along the first direction,
the second circuit area includes a third gate stack being longitudinally oriented along the second direction and extending over the third active region and the fourth active region,
the third gate stack includes a third gate segment contacting the third active region and a fourth gate segment contacting the fourth active region, wherein the third gate segment and the fourth gate segment are different in composition, and wherein the third gate segment is associated with a second pFET and the fourth gate segment is associated with a second nFET, and
the second transition area includes a fourth gate stack being longitudinally oriented along the second direction and spans between opposite cell edges of the second standard cell, the fourth gate stack including only one gate segment.

3. The integrated circuit of claim 1, wherein the first transition area includes a third gate stack being longitudinally oriented along the second direction and spans between the opposite cell edges of the first standard cell, and wherein the third gate stack is distanced from the second gate stack along the first direction.

4. The integrated circuit of claim 1, wherein
the first circuit area includes a first n-type doped well and a first p-type doped well extending along the first direction, and
the first transition area includes a doped well spanning between the opposite cell edges of the first standard cell along the second direction.

5. The integrated circuit of claim 4, wherein the first transition area further includes
a fifth active region and a sixth active region, the second gate stack being extending over and contacting the fifth and sixth active regions, and
a fifth gate stack disposed on and contacting an isolation feature, the fifth gate stack being extending through the opposite cell edges of the first standard cell along the second direction.

6. The integrated circuit of claim 5, wherein
the first transition area further includes a sixth gate stack and seventh gate stack being longitudinally oriented along the second direction,
the sixth gate stack is partially landing on edges of the fifth and sixth active regions and is partially landing on the isolation feature, and
the seventh gate stack is partially landing on opposite edges of the fifth and sixth active regions and is partially landing on the isolation feature.

7. The integrated circuit of claim 6, wherein
the first circuit area further includes an eighth gate stack and a ninth gate stack being longitudinally oriented along the second direction,
the eighth gate stack is partially landing on edges of the first and second active regions and is partially landing on the isolation feature, and
the ninth gate stack is partially landing on opposite edges of the first and second active regions and is partially landing on the isolation feature.

8. The integrated circuit of claim 7, wherein
the first circuit area further includes a second n-type doped well extending along the first direction,
the first circuit area further includes a seventh active region disposed on the second n-type doped well, and
the first gate stack is extending over and contacting the seventh active region.

9. An integrated circuit, comprising a first standard cell formed on a substrate and having a first circuit area and a first transition area placed on an edge of the first circuit area, wherein
the first circuit area includes a first active region and a second active region being longitudinally oriented along a first direction,
the first circuit area includes a first gate stack being longitudinally oriented along a second direction and extending over the first active region and the second active region, the second direction being perpendicular to the first direction,
the first gate stack includes a first gate segment contacting the first active region and a second gate segment contacting the second active region, wherein the first gate segment and the second gate segment are different in composition, and wherein the first gate segment is associated with a first p-type field-effect transistor (pFET) and the second gate segment is associated with a first n-type field-effect transistor (nFET), the first transition area further includes a third active region and a fourth active region being longitudinally oriented along the first direction,
the first transition area includes a second gate stack and a third gate stack being longitudinally oriented along the second direction and spanning between opposite cell edges of the first standard cell, each of the second and third gate stack is a lengthwise uniform gate stack, and
the first standard cell includes a dielectric gate disposed on an interface between the first circuit and first transition areas.

10. The integrated circuit of claim 9, wherein
the second gate stack is extending over and contacting the third and fourth active regions,
the third gate stack is distanced away from the third and fourth active regions, and
the third gate stack is disposed on and contacting an isolation feature surrounding the first, second, third and fourth active regions.

11. The integrated circuit of claim 10, further comprising a second standard cell, wherein
the second standard cell includes a second circuit area and a second transition area placed on an edge of the second circuit area, and
the second standard cell is placed in abutment with the first standard cell such that the first and second transition areas share a common edge.

12. The integrated circuit of claim 11, wherein
the second circuit area includes a fifth active region and a sixth active region being longitudinally oriented along the first direction,
the second circuit area includes a fourth gate stack being longitudinally oriented along the second direction and extending over the fifth and sixth active regions,
the fourth gate stack includes a third gate segment contacting the fifth active region and a fourth gate segment contacting the sixth active region, wherein the third gate segment and the fourth gate segment are different in composition, and wherein the third gate segment is associated with a second pFET and the fourth gate segment is associated with a second nFET,
the second transition area further includes a seventh active region and an eighth active region being longitudinally oriented along the first direction, and
the second transition area includes a fifth gate stack and a sixth gate stack being longitudinally oriented along the second direction and spanning between opposite cell edges of the second standard cell, each of the fifth and sixth gate stack including only one gate segment.

13. The integrated circuit of claim 12, wherein
the fifth gate stack is extending over and contacting the seventh and eighth active regions,
the sixth gate stack is distanced away from the seventh and eighth active regions, and
the sixth gate stack is disposed on and contacting a portion of the isolation feature extending to the second standard cell.

14. The integrated circuit of claim 13, wherein
the first circuit area includes a first n-type doped well and a first p-type doped well extending along the first direction, and
the first transition area includes a doped well spanning between the opposite cell edges of the first standard cell along the second direction.

15. The integrated circuit of claim 14, wherein
the second circuit area includes a second n-type doped well and a second p-type doped well extending along the first direction, and
the second transition area includes another doped well spanning between the opposite edges of the second standard cell along the second direction.

16. The integrated circuit of claim 15, wherein
the first transition area further includes a seventh gate stack and eighth gate stack being longitudinally oriented along the second direction,
the seventh gate stack is partially landing on edges of the third and fourth active regions and is partially landing on the isolation feature, and
the eighth gate stack is partially landing on opposite edges of the third and fourth active regions and is partially landing on the isolation feature.

17. The integrated circuit of claim 16, wherein
the first circuit area further includes a ninth gate stack and a tenth gate stack being longitudinally oriented along the second direction,
the ninth gate stack is partially landing on edges of the first and second active regions and is partially landing on the isolation feature; and
the tenth gate stack is partially landing on opposite edges of the first and second active regions and is partially landing on the isolation feature.

18. The integrated circuit of claim 17, wherein
the first circuit area further includes a third n-type doped well extending along the first direction,
the first circuit area further includes a ninth active region disposed on the third n-type doped well; and
the first gate stack is extending over and contacting the ninth active region.

19. A method of making an integrated circuit, comprising forming a first standard cell and a second standard cell on a semiconductor substrate, wherein
the first standard cell includes a first circuit area and a first transition area placed on an edge of the first circuit area,
the first circuit area includes a first active region and a second active region being longitudinally oriented along a first direction,
the first circuit area includes a first gate stack being longitudinally oriented along a second direction and extending over the first active region and the second active region, the second direction being perpendicular to the first direction,
the first gate stack includes a first gate segment contacting the first active region and a second gate segment contacting the second active region, wherein the first gate segment and the second gate segment are different in composition, and wherein the first gate segment is associated with a first p-type field-effect transistor (pFET) and the second gate segment is associated with a first n-type field-effect transistor (nFET),
the first transition area includes a second gate stack being longitudinally oriented along the second direction and spans between opposite cell edges of the first standard cell, wherein the second gate stack is a lengthwise uniform gate stack,
the first standard cell further includes a dielectric gate disposed at an interface between the first circuit area and the first transition area, and
the second standard cell includes a second circuit area and a second transition area placed on an edge of the second circuit area, the first and second transition areas sharing a common edge, wherein
the second circuit area includes a third active region and a fourth active region being longitudinally oriented along the first direction,
the second circuit area includes a third gate stack being longitudinally oriented along the second direction and extending over the third active region and the fourth active region,
the third gate stack includes a third gate segment contacting the third active region and a fourth gate segment contacting the fourth active region, wherein the third gate segment and the fourth gate segment are different in composition, and wherein the third gate segment is associated with a second pFET and the fourth gate segment is associated with a second nFET, and
the second transition area includes a fourth gate stack being longitudinally oriented along the second direction and spans between opposite cell edges of the second standard cell, the second gate stack includes only one gate segment.

20. The method of claim 19, wherein the first transition area includes a fifth gate stack being longitudinally oriented along the second direction and spans between the opposite cell edges of the first standard cell, and wherein the fifth gate stack is distanced from the second gate stack along the first direction.

* * * * *